US010101569B2

(12) United States Patent
Bauer

(10) Patent No.: US 10,101,569 B2
(45) Date of Patent: Oct. 16, 2018

(54) MIRROR, IN PARTICULAR COLLECTOR MIRROR FOR MICROLITHOGRAPHY

(71) Applicant: Carl Zeiss SMT GmbH, Oberkochen (DE)

(72) Inventor: Markus Bauer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 38 days.

(21) Appl. No.: 15/601,337

(22) Filed: May 22, 2017

(65) Prior Publication Data
US 2017/0254995 A1    Sep. 7, 2017

Related U.S. Application Data

(63) Continuation of application No. PCT/EP2015/077717, filed on Nov. 26, 2015.

(30) Foreign Application Priority Data

Nov. 27, 2014  (DE) .................. 10 2014 117 453

(51) Int. Cl.
G03F 7/20         (2006.01)
G02B 19/00       (2006.01)
G02B 5/09         (2006.01)
G21K 1/06         (2006.01)

(52) U.S. Cl.
CPC .......... G02B 19/0023 (2013.01); G02B 5/09 (2013.01); G03F 7/70033 (2013.01); G03F 7/70158 (2013.01); G03F 7/70175 (2013.01); G03F 7/70575 (2013.01); G21K 1/062 (2013.01); G21K 2201/064 (2013.01)

(58) Field of Classification Search
CPC .... G02B 19/0023; G02B 5/09; G02B 5/1838; G02B 5/1861; G02B 5/0891; G02B 5/10;
(Continued)

(56) References Cited

U.S. PATENT DOCUMENTS 4,995,714 A * 2/1991 Cohen ................. G02B 5/1876
                                                351/159.41
5,153,780 A * 10/1992 Jorgensen ............... G02B 5/10
                                                     359/853
(Continued)

FOREIGN PATENT DOCUMENTS

DE   10 2009 044 462 A1    1/2011
DE   10 2010 063 530 A1    6/2011
(Continued)

OTHER PUBLICATIONS

International Search Report for corresponding Appl No. PCT/EP2015/077717, dated Mar. 29, 2016.
(Continued)

Primary Examiner — Collin X Beatty
(74) Attorney, Agent, or Firm — Fish & Richardson P.C.

(57) ABSTRACT

A collector mirror for an EUV microlithography system. The collector mirror includes an optical grating having an optically effective mirror surface, which reflects electromagnetic used rays in an EUV spectral range emanating from a first focal point and focuses them onto a second focal point. The first and second focal points lie on a side of the optical grating facing the mirror surface and define an optical axis. The optical grating is configured, in interaction with a stop arranged at the second focal point, to allow the used rays to pass through the stop and to block electromagnetic remaining rays in a remaining spectral range different than the EUV spectral range. The optical grating includes a blazed grating composed of a plurality of mirror facets, each having a facet surface. The facet surfaces form the mirror surface of the blazed grating.

20 Claims, 5 Drawing Sheets

(58) Field of Classification Search
CPC .............. G02B 5/0825; G02B 26/0808; G02B 26/0816; G03F 7/70033; G03F 7/70158; G03F 7/70175; G03F 7/70575; G03F 7/702; G21K 1/062; G21K 1/067; G21K 2201/064; G21K 2201/067; G21K 2201/06
USPC ....... 359/572, 570, 576, 350, 569, 571, 574, 359/566; 250/504 R; 438/32
See application file for complete search history.

(56) References Cited

U.S. PATENT DOCUMENTS

| | | | |
|---|---|---|---|
| 5,408,363 A * | 4/1995 | Kano ................. | G02B 5/10 359/869 |
| 9,470,824 B2 * | 10/2016 | Zhou .................. | G02B 5/1847 |
| 2009/0267003 A1 | 10/2009 | Moriya et al. | |
| 2009/0289205 A1 | 11/2009 | Moriya et al. | |
| 2013/0207004 A1 | 8/2013 | Ceglio et al. | |

FOREIGN PATENT DOCUMENTS

| | | |
|---|---|---|
| DE | 10 2013 002 064 A1 | 8/2013 |
| WO | WO 2014/170093 A2 | 10/2014 |

OTHER PUBLICATIONS

International Preliminary Report on Patentability, with translation thereof, for corresponding Appl No. PCT/EP2015/077717, dated May 30, 2017.

* cited by examiner

Spatial frequency q   Order of diffraction

MIRROR, IN PARTICULAR COLLECTOR MIRROR FOR MICROLITHOGRAPHY

CROSS-REFERENCE TO RELATED APPLICATIONS

The present application is a continuation of, and claims benefit under 35 USC 120 to, international application PCT/EP2015/077717, filed Nov. 26, 2015, which claims benefit under 35 USC 119 of German Application No. 10 2014 117 453.4, filed Nov. 27, 2014. The entire disclosure of these applications are incorporated by reference herein.

FIELD

The disclosure relates to a collector mirror for an EUV microlithography system.

BACKGROUND

A collector mirror for an EUV microlithography system is known from US 2009/0267003 A1.

A collector mirror of this type is used in EUV microlithography, which involves a method for producing and structuring semiconductor components, integrated circuits and components appertaining to micro- and nanosystems engineering. In microlithography, structures that are predefined on a reticle are imaged onto a substrate, for example a silicon substrate, with the aid of exposure processes. In this case, the substrate is coated with a light-sensitive material, which is generally known as "photoresist". During exposure, the exposure light interacts with the photoresist layer, with the result that the chemical properties of the exposed regions of the photoresist layer change. In a subsequent development step, the photoresist dissolves in the exposed or non-exposed regions, depending on whether a "positive" or a "negative" photoresist is used. Finally, the regions of the substrate surface which are not covered by the remaining photoresist are removed in an etching method, for example wet-chemical etching, plasma etching or plasma-assisted reactive ion etching. This gives rise to the predefined structures of the reticle on the processed substrate surface on a projection scale that is characteristic of the microlithography system used, in particular a projection exposure apparatus.

The performance of the microlithographically produced semiconductor components or integrated circuits is all the higher, the higher the integration density of the structures in the components. In other words, one endeavor consists in imaging increasingly finer structures onto the substrate. The lower limit of the structure size achievable in optical lithography is determined, inter alia, by the wavelength of the exposure light used. Therefore, it is advantageous to use exposure light having the shortest possible wavelength. With regard to this aspect, projection exposure apparatuses are known which use extreme ultraviolet (EUV) light as exposure light, the wavelength of which is 13.5 nm.

The EUV light is generated by an EUV light source in which a plasma is generated by strong electrical discharges (referred to as: Gas Discharge Produced Plasma, GDPP) or by focusing of laser radiation (referred to as: Laser-Produced Plasma LPP). In the LPP method, a tin droplet is bombarded with pump light, wherein infrared (IR) light is usually used as pump light. The generated plasma contains a multiplicity of charge particles, for example electrons, which fall from energetically high states to energetically lower states and emit the desired EUV light in the process. Furthermore, on account of the high temperature prevailing in the plasma, for example above 200,000 K, EUV light can be emitted in the form of black body radiation. The EUV light generated propagates in all spatial directions. In order that the EUV light becomes usable as used rays for the exposure process, the largest possible portion thereof is directed in the direction of the illumination and projection optical unit by a collecting optical unit, which is known by the term "collector mirror".

Collector mirrors known from the prior art include an elliptical mirror surface for the purpose of better light focusing. However, they have the disadvantage that, as the density of the tin plasma increases, the plasma frequency can increase greatly. In this case, besides the used rays, remaining rays, i.e. electromagnetic rays from a remaining spectral range different than the EUV spectral range, which are not usable for the exposure process, may also be reflected at the mirror surface of the collector mirror and be focused onto the second focal point. Finally, the remaining rays may pass into the illumination and imaging optical unit and even as far as the substrate. The remaining rays typically include highly intensive IR light and deep ultraviolet (DUV) light. The remaining rays cause a considerable input of heat to the optical units disposed downstream of the collector mirror and thus an unacceptable impairment of the optical properties of these optical units.

In order to address this issue, further elliptical collector mirrors are known which are embodied as Spectral Purity Filters (SPF) and include a binary grating. The binary grating serves to reflect the EUV light emitted at the first focal point and to focus it onto a second focal point, wherein the focused EUV light passes through a stop situated at the second focal point, while the IR pump light is blocked there. As a result, the IR pump light is suppressed.

However, collector mirrors of this type can have the disadvantage that the binary grating can effectively suppress only remaining rays of a single wavelength, wherein this is possible moreover only if the grating parameters of the binary grating, for example the grating period, were controlled very accurately during manufacture. Additional manufacturing outlay arises here. In addition, the remaining rays in a broadband remaining spectral range have to be suppressed in the imaging beam path, which additionally increases the manufacturing outlay.

Furthermore, the binary grating can have surfaces roughnesses with dimensions in the range of medium-wave wavelengths. Such surface roughnesses are attributable to vibrations and accuracy limitations of the devices used for producing the binary grating. They have the effect that the EUV light generated is not focused exactly onto the second focal point of the collector mirror, but rather onto an extended region around the second focal point. The second focal point for the EUV light is also referred to as "intermediate focal point (IF)". A widening of the IF occurs undesirably. In order to allow the used rays to pass through the stop as completely as possible, the aperture of the stop is correspondingly enlarged. However, this leads to increased transmission of the remaining rays.

A further possible disadvantage of such SPF collector mirrors is that the collector mirror has to be formed with a very large diameter in order to take account of the desire for a large working distance and a small IF-side numerical aperture (NA) simultaneously. The larger the diameter of the collector mirror, the greater the extent to which the imaging scale of the collector mirror varies along the elliptical mirror surface. The imaging scale is defined as the ratio between the distance from the first focal point to the ray incidence point on the mirror surface, on the one hand, and the distance from the ray incidence point to the second focal point, on the other hand. This leads undesirably to an enlargement of the envelope of the etendue, in particular at the IF and/or in the far field. The abovementioned surface roughnesses, too, additionally foster the enlargement of the envelope of the etendue.

An enlargement of the envelope of the etendue can cause a loss of the used rays generated, which has a serious effect on the exposure quality and/or the imaging quality in extreme illumination modes of an EUV microlithography system.

US 2009/0267003 A1 discloses further elliptical collector mirrors including a blazed grating including a plurality of mirror facets. It is true that the used rays can thereby be focused with an increased transmission efficiency. Nevertheless, issues associated with the possible disadvantages mentioned above, for example the loss of used rays, remain very largely unsolved.

DE 10 2013 002 064 A1 discloses a collector mirror for collecting EUV radiation, which collector mirror includes an optical grating including a plurality of grating elements. The grating elements may be embodied such that they constitute sections of ellipsoids.

SUMMARY

The disclosure seeks to develop a collector mirror of the type mentioned in the introduction to the effect that the loss of used rays is reduced with at the same time intensified suppression of remaining rays, for example IR light and DUV light.

The disclosure provides a collector mirror mentioned in which facet surfaces, in a sectional plane including the optical axis, are arranged on a plurality of imaginary elliptical shells which are displaced from one another along the optical axis and the common mathematical focus points of which coincide with the first and the second focal points, wherein the mirror surface extends along the imaginary elliptical shells, and that a marginal-region-side mirror facet of an adjacent mirror facet pair is arranged on a first elliptical shell, wherein a vertex-region-side mirror facet of the mirror facet pair is arranged on a second elliptical shell adjacent to the first elliptical shell, wherein the first elliptical shell is displaced along the optical axis from the second elliptical shell toward the first focal point.

Each facet surface is arranged on the elliptical shell in such a way that the facet surface extends along the elliptical shell or tangentially with respect to the elliptical shell. Since the plurality of imaginary elliptical shells have common focus points, these elliptical shells form an imaginary confocal ellipse family. Each elliptical shell corresponds mathematically to an imaginary ellipsoidal shell that is rotationally symmetrical at least in sections relative to the optical axis. Consequently, each facet surface considered spatially is arranged on an imaginary ellipsoidal shell, wherein the individual imaginary ellipsoidal shells form a confocal ellipsoid family. The mirror surface resulting therefrom runs along a path arrangement including circular paths which are concentric relative to the optical axis and are spaced apart from one another in the direction of the optical axis, or alternatively along a spiral path around the optical axis.

The collector mirror according to the disclosure is thus able to block remaining rays from a particularly wide remaining spectral range. In contrast to previous SPF gratings, in particular binary gratings, which merely enable an effective remaining ray suppression of a single wavelength, a broadband remaining ray suppression is advantageously achieved with the aid of the collector mirror according to the disclosure.

Furthermore, the mirror surface of the collector mirror deviates from an elliptical mirror surface. In the case of elliptical collector mirrors, i.e. collector mirrors having an elliptical mirror surface, there is a variation of the imaging scale of the imaging from the first focal point onto the second focal point of the collector mirror. This leads to a greatly enlarged envelope of the etendue, in particular at the IF and/or in the far field. This results in a high loss of used rays since the used rays at the IF are not focused to form a beam of rays having a sufficiently small diameter to pass completely through the stop.

In contrast thereto, the collector mirror according to the disclosure images used rays from the first focal point onto the second focal point, wherein the variation of the imaging scale along the mirror surface is at least reduced on account of the arrangement of the facet surfaces on the confocal ellipse family. The enlargement of the envelope of the etendue is thus reduced. This enables a reduced loss of used rays even in extreme illumination modes of the EUV microlithography system. The EUV light generated is focused at the IF to form a beam of rays having a reduced diameter. A stop having a smaller stop aperture can thus be used. This increases the proportion of remaining rays blocked by the stop.

At the same time, the optical units disposed downstream of the collector mirror are better protected against contamination by the EUV light source. Cleaning gases, e.g. of the $H_2$ gas, which serve for protecting the optical units can advantageously be used with a reduced gas pressure, which, besides cost-effectiveness, improves the transmission of the EUV light through the gas atmosphere.

The mirror surface of the collector mirror can extend from a vertex region as far as a marginal region of the imaginary elliptical shells. It is likewise possible, however, for the mirror surface not to extend right into the vertex region; by way of example, the mirror surface may be absent in the vertex region of the imaginary elliptical shells, for example have a perforation or a hole there.

Furthermore, it is provided that a marginal-region-side mirror facet of an adjacent mirror facet pair is arranged on a first elliptical shell, wherein a vertex-region-side mirror facet of the mirror facet pair is arranged on a second elliptical shell adjacent to the first elliptical shell, wherein the first elliptical shell is displaced along the optical axis from the second elliptical shell toward the first focal point.

In this configuration, in other words, of two adjacent mirror facets, that mirror facet which is nearer to the marginal region of the mirror surface is situated on an imaginary elliptical shell which is nearer to the first focal point than the imaginary elliptical shell on which is situated that mirror facet of the two mirror facets which is nearer to the vertex region. If this is the case for all the mirror facets, for example the mirror surface of the collector mirror in the sectional plane may be "protuberant" toward the vertex in comparison with an elliptical mirror surface. That is to say that in comparison with an imaginary elliptical shell which overlaps the mirror surface of the collector mirror in the marginal region, the mirror surface of the collector mirror in the vertex region is then curved in a direction away from the imaginary elliptical shell. Advantageously, in comparison with the previous collector mirrors, the collector mirror according to the disclosure can be formed with a smaller collector diameter and thus more compactly with the working distance remaining the same and/or with a larger working distance and thus with greater radiation resistance with the collector diameter remaining the same. However, it is likewise possible that the configuration mentioned above may lead to a mirror surface that is not "protuberant", as will be described later in connection with an embodiment of the collector mirror with a constant imaging scale. The terms "vertex-region-side" and "marginal-region-side" are relative and should be understood in relation to the course of the mirror surface and bear the meaning "comparatively nearer to the vertex region or further away from the marginal region" and "comparatively nearer to the marginal region or further away from the vertex region", respectively.

The plurality of imaginary elliptical shells are not physical shells of the collector mirror, but rather merely serve to mathematically elucidate the construction of the blazed grating. Furthermore, in the context of this disclosure, the term "focal point" should be understood as a physical or optical feature of the present collector mirror, while the term "focus point" serves merely for mathematically elucidating the present disclosure.

In one preferred configuration, the blazed grating has a blaze angle by which the facet surfaces are inclined in each case locally relative to a grating surface, wherein the blaze angle increases from the marginal region toward the vertex region.

In the context of this configuration, the blaze angle can increase continuously from the marginal region toward the vertex region, wherein this configuration also encompasses the case were the blaze angle is constant in sections from the marginal region toward the vertex region. In the case of a faceted optical unit or grating optical unit, shading effects occur in which part of the specular facet reflection, i.e. of the used rays reflected at the mirror surface, is blocked by a neighbouring mirror facet. These shading effects are associated with the blaze angle profile. Advantageously, a reduction of the shading effects is achieved with the aid of this measure.

In a further preferred configuration, the facet surfaces are distributed along the elliptical shells such that the facet surfaces are arranged at intersection points of the elliptical shells with at least one section of an imaginary circular line, wherein for each point on the circular line the ratio of the distance from the first focal point to the point and the distance from the point to the second focal point has the same value.

This measure has the advantage that the imaging scale for the mirror facets which satisfy this arrangement specification is constant or at least approximately constant. Light from the first focal point is imaged sharply onto the second focal point by all mirror facets which satisfy this arrangement specification. The collector mirror can be configured such that all the mirror facets present fulfil this arrangement specification, such that the imaging scale of the mirror surface as a whole is constant.

A further advantage of this measure is that the collector mirror can have a spherical surface on the substrate side, which advantageously simplifies the manufacture of the collector mirror.

The configuration mentioned above is also regarded as an independent disclosure without the feature of a marginal-region-side mirror facet of an adjacent mirror facet pair arranged on a first elliptical shell, wherein a vertex-region-side mirror facet of the mirror facet pair is arranged on a second elliptical shell adjacent to the first elliptical shell, and wherein the first elliptical shell is displaced along the optical axis, as viewed from the first focal point, from the second elliptical shell toward the first focal point. Moreover, this configuration can be employed not only for a collector mirror, but advantageously also for an imaging mirror within the EUV lithography system, for example in the projection lens, because such a mirror enables a very sharp imaging. The mirror surface of such an imaging mirror can be arranged in particular completely outside the optical axis ("off-axis").

In a further preferred configuration, in each case only one facet surface is arranged on the elliptical shells.

On account of the simplified assignment between facet surfaces and elliptical shells, the design complexity for the focal point is reduced, such that the collector mirror according to the disclosure is producible particularly simply and, in association therewith, particularly cost-effectively.

In a further preferred configuration, the elliptical shells are spaced apart substantially equidistantly from one another along the optical axis.

On account of the simplified geometrical form of the confocal ellipse family, the blazed grating can be designed without high computational complexity. This advantageously leads to increased production simplicity and cost-effectiveness.

In a further preferred configuration, at least two mirror facets have a focal length reciprocal value of at least approximately 0, or the at least two mirror facets have an identical focal length reciprocal value.

With the aid of this measure, it is possible to embody and/or use a plurality of mirror facets having the same focal length. As a result, the collector mirror according to the disclosure can be produced with a lower outlay. Preferably, the focal length reciprocal value is vanishingly small or equal to zero for all the mirror facets. This leads to an advantageously reduced gradient error of the facet surfaces and/or of the facet edges. In addition, the facet surfaces can be embodied as plane facet surfaces, which increases the production simplicity of the collector mirror.

In a further preferred configuration, the blazed grating includes a diffraction grating for diffracting the remaining rays, wherein the used rays reflected at the mirror surface are deflected from the diffracted remaining rays of the zero order of diffraction by at least twice the blaze angle and/or pass between the diffracted remaining rays of the zero and the first orders of diffraction.

The specular facet reflection of the incident used rays passes separately from the diffracted remaining rays. Consequently, the used rays are focused solely onto the intermediate focal point (IF). Advantageously, the remaining rays of different orders of diffraction are effectively suppressed, such that substantially only the used rays pass through the stop.

In a further preferred configuration, the remaining spectral range includes an infrared spectral range, wherein the zero and the first orders of diffraction are related to the diffracted remaining rays having a minimum wavelength of the remaining spectral range.

The specular facet reflection of the incident used rays passes separately from the diffracted IR light of the zero and first orders of diffraction and can thus pass solely through the aperture of the stop, without being superimposed with the IR light of the lowest orders of diffraction. Advantageously, the highly intensive IR light that is undesired for the exposure process is suppressed particularly effectively as a result.

In a further preferred configuration, the facet surfaces have in the sectional plane in each case a facet length, wherein at least two facet lengths are different and/or the facet length does not exceed a maximum facet length chosen depending on a minimum wavelength of the remaining spectral range.

With the aid of a facet length that varies along the mirror surface, the collector mirror can be fashioned particular flexibly to fulfil diverse practical desired performance in EUV microlithography. Furthermore, the collector mirror suppresses short-wave remaining rays particularly effectively.

In a further preferred configuration, the facet length is in the range of 10 μm to 200 μm.

In this configuration, the facet length is sufficiently large in comparison with the wavelength of the EUV light, such that diffraction effects with respect to the EUV light are suppressed to the greatest possible extent. The reflected EUV light passes substantially in one direction and can thus be focused particularly effectively onto the second focal point. At the same time, the facet length is sufficiently short, such that diffraction effects with respect to the IR light and the DUV light cannot be disregarded.

In a further preferred configuration, the blazed grating has a surface roughness in the range of 0 to 0.2 nm.

The used rays can thus be focused onto the second focal point with increased accuracy. The widening of the intermediate focal point is reduced, such that stops having a reduced stop aperture can be used for the purpose of suppressing the remaining rays more effectively.

In a further preferred configuration, the blazed grating has an edge rounding having a radius in the range of 0 to 1 μm.

The edge rounding of the collector mirror according to the disclosure is sufficiently reduced, such that the accuracy of the used ray focusing is increased. Stops having an additionally reduced stop aperture can be used, which reduces the impingement of the remaining rays on the illumination and projection optical unit.

In a further preferred configuration, the blazed grating is produced from a grating workpiece in an ultra-precision turning method in which a machining tool is moved relative to the grating workpiece along a spiral path and/or a path arrangement composed of concentric circles.

The blazed grating is formed with increased precision with regard to the profile of the blaze angle and/or the facet length. In the case of a spiral relative movement of the machining tool, for example of a diamond tool, with respect to the grating workpiece, it is not necessary for the tool to be alternately moved to and away from the workpiece, with the result that the structuring times are advantageously particularly short. Furthermore, the influence of vibrations of the diamond tool on the grating quality is reduced.

In a further preferred configuration, the mirror facets are produced in each case in a single machining process in which the mirror surface is engaged by a pressure side of the machining tool facing the mirror surface.

The processing time of the mirror facets thereby becomes shorter than in the case of conventional mirror facets. The facet surfaces can be formed as an "image" of the pressure side, for example of a plane pressure side, such that the surface quality of the facet surfaces substantially only depends on the constitution of the pressure side. The gradient error of the facet surfaces is advantageously reduced.

In a further preferred configuration, the facet surfaces are surface-processed in a smoothing method, downstream of the ultra-precision turning method, using ion beams and/or at least one liquid film.

The surface roughness of the facet surfaces is additionally reduced as a result. Furthermore, the facet surfaces that are surface-processed by this means are particularly uniform.

In a further preferred configuration, the facet surfaces are coated with a layer stack including a plurality of alternating individual layers of molybdenum and silicon (MoSi), wherein a layer thickness of the individual layers is chosen depending on a local ray incidence angle with respect to the individual facet surfaces.

The reflection properties of the individual mirror facets are improved with the aid of the MoSi layers. On account of the chosen layer thickness of the MoSi layers, the EUV light is advantageously focused onto the second focal point with an increased precision that is uniform for all the mirror facets.

In accordance with a further aspect, the disclosure is based on the object of providing a mirror, in particular for an EUV microlithography system, or for the UV spectral range, which mirror includes an optical grating having an optically effective mirror surface and overall has an at least approximately constant imaging scale across the mirror surface.

In accordance with the further aspect, this object is achieved via a mirror including an optical grating having an optically effective mirror surface, which reflects electromagnetic rays emanating from a first focal point and focuses them onto a second focal point, wherein the first and the second focal points lie on a side of the optical grating facing the mirror surface and define an optical axis, wherein the optical grating includes a plurality of mirror facets each having a facet surface, wherein the facet surfaces form the mirror surface of the grating. According to the disclosure, the facet surfaces, in a sectional plane including the optical axis, are arranged on a plurality of imaginary elliptical shells which are displaced from one another along the optical axis and the common mathematical focus points of which coincide with the first and the second focal points, wherein the facet surfaces are distributed along the elliptical shells such that the facet surfaces are arranged at intersection points of the elliptical shells with at least one section of an imaginary circular line, wherein for each point on the circular line the ratio of the distance from the first focal point to the point and the distance from the point to the second focal point has the same value.

In terms of the geometry, the set of all points for which the ratio of the distances to two predefined points has a predefined value is also referred to as an Apollonian circle. In accordance with the present aspect of the disclosure, the facet surfaces are accordingly not just arranged on ellipse families displaced relative to one another, but moreover in such a way that the facet surfaces are additionally arranged on an Apollonian circle, with the first and second focal points as fixed points. The advantage here is that the substrate surface of the mirror can be spherical, which significantly simplifies the manufacture of the mirror. On account of the arrangement of the facet surfaces distributed among the elliptical shells along a section of an Apollonian circle, all the facet surfaces image the first focal point onto the second focal point with an identical imaging scale. Such a mirror can be used not only as a collector mirror, but also generally as an imaging mirror, because the mirror, by virtue of the configuration according to the disclosure, brings about a very sharp imaging from the first focal point into the second focal point.

In one development, base points of the mirror facets are arranged at the intersection points.

This results in an accurate assignment of each facet to the intersection points of the elliptical shells with the Apollonian circle, thus resulting a very accurate arrangement specification of the mirror facets for manufacture.

Furthermore, it is preferred if the mirror surface is arranged completely outside the optical axis.

In this configuration, the mirror according to the disclosure is suitable in particular as an imaging mirror, for example in an EUV microlithography system, or else in a UV-optical system.

The optical grating of the mirror according to the disclosure is preferably a blazed grating or a Fresnel structure.

Further advantages and features will become apparent from the following description and the accompanying drawing.

It is understood that the aforementioned features and those yet to be explained below may be used not only in the respectively specified combination but also in other combinations or on their own, without departing from the scope of the present disclosure.

BRIEF DESCRIPTION OF THE DRAWINGS

Exemplary embodiments of the disclosure are illustrated in the drawing and described hereinafter with reference thereto. In the figures.

DESCRIPTION OF EXEMPLARY EMBODIMENTS

Figure 1:
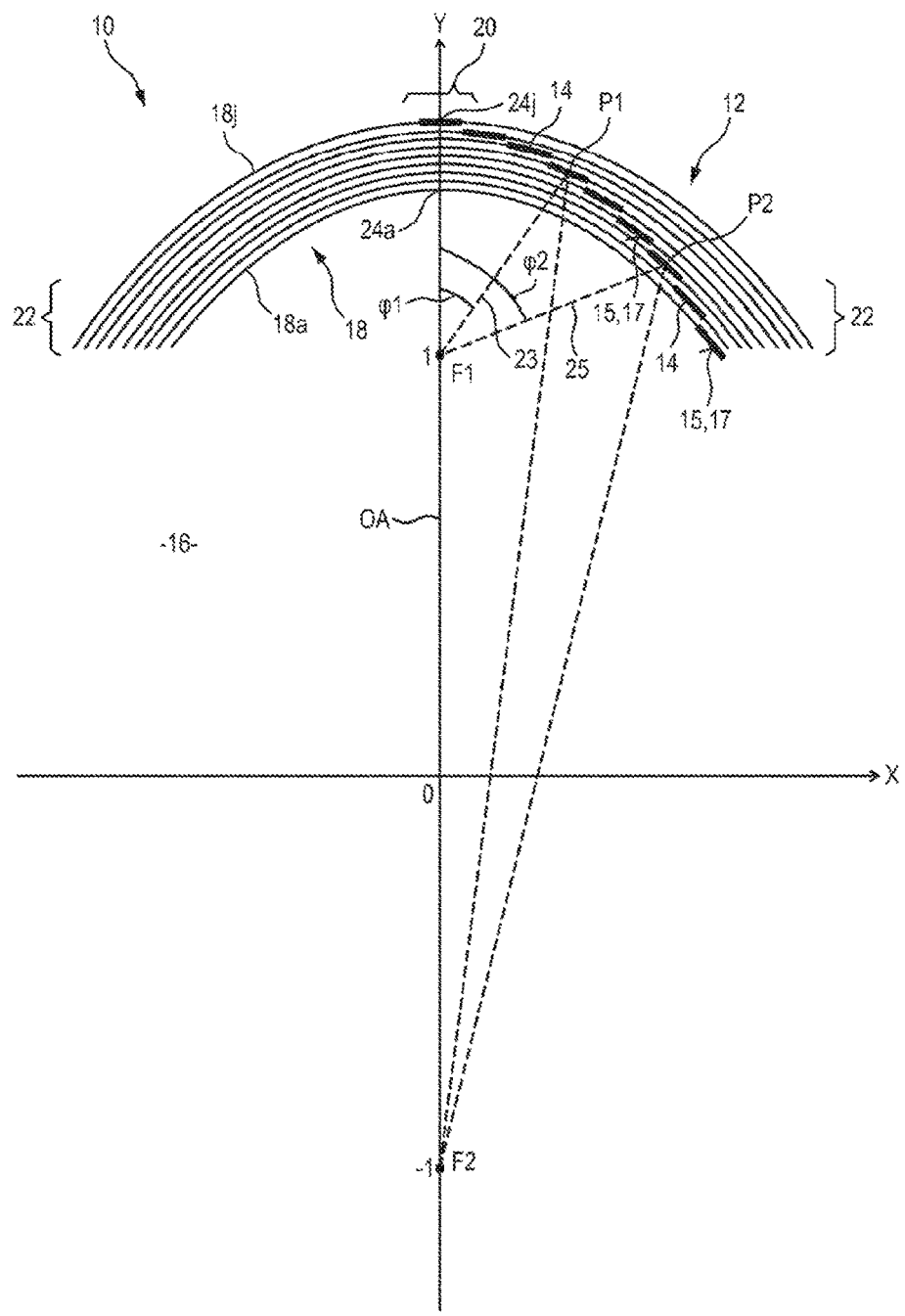
FIG. 1 shows a schematic sectional illustration of a collector mirror in accordance with one exemplary embodiment.

FIG. 1 shows, in a schematic sectional illustration, a collector mirror in accordance with one exemplary embodiment, which collector mirror is provided generally with the reference sign 10. The collector mirror 10 serves for collecting or focusing EUV light in an EUV light source of an EUV microlithography system and includes an optical grating 12, which is referred to hereinafter as blazed grating. The blazed grating 12 includes a plurality of mirror facets 14 each having an facet surface 15. The facet surfaces 15 of the mirror facets 14 together form a sawtooth-shaped, "blazed" mirror surface 17.

The facet surfaces 15 are arranged in a sectional plane 16 on a plurality of imaginary elliptical shells 18a-j. In FIG. 1, only the innermost elliptical shell 18a and the outermost elliptical shell 18j are respectively provided with a reference sign, for reasons of clarity. The facet surfaces 15 are arranged in each case on one of the plurality of imaginary elliptical shells 18a-j, wherein the facet surfaces 15 extend along or tangentially with respect to the respective elliptical shell 18a-j. The elliptical shells 18a-j have two common focus points, which coincide with a first focal point F1 and a second focal point F2 of the collector mirror. Consequently, the elliptical shells 18a-j form an imaginary confocal ellipse family 18. In the exemplary embodiment shown, the mirror surface 17 of the blazed grating 12 extends in the sectional plane 16 from a vertex region 20 as far as a marginal region 22 of the confocal ellipse family 18. However, the mirror surface 17 may also be absent in the vertex region 20, and the collector mirror 10 may have a perforation or a hole there.

In the sectional illustration in FIG. 1, the facet surfaces 15 are shown only on one half of the elliptical shells 18a-j for the purpose of simplification. Considered spatially, the blazed grating 12 is embodied such that it is rotationally symmetrical about an optical axis OA at least in sections, wherein the optical axis OA is defined by the first focal point F1 and the second focal point F2. In this case, the mirror surface 17 can run along a spiral path around the optical axis OA. Alternatively, the mirror surface 17 can run along a plurality of circular paths which are concentric with respect to the optical axis OA and are spaced apart from one another in the direction of the optical axis OA.

For mathematically elucidating the confocal ellipse family 18, FIG. 1 shows a Cartesian coordinate system, the y-axis of which coincides with the optical axis OA and the origin of which is the midpoint between the first and the second focal points F1, F2. For the purpose of simplification, all coordinates are normalized to the focal length, i.e. the distance from the origin to the focal point F1, F2. As can be seen in FIG. 1, each of the imaginary elliptical shells 18a-j intersects the y-axis in each case at an associated longitudinal axis intersection point or vertex point 24a-j, wherein only the innermost and outermost longitudinal axis intersection points 24a,j are respectively provided with a reference sign for reasons of clarity. The coordinates (0, yn) are assigned to the longitudinal axis intersection points 24a-j. Here the index n=a, b, c, ..., j relates to the numbering of the individual elliptical shells 18a-j. Each imaginary elliptical shell 18a-j is part of an associated ellipse which intersects the x-axis at a transverse axis intersection point with the coordinates (xn, 0), but this is not shown in FIG. 1 for reasons of simplification. The points lying on each imaginary elliptical shell 18a-j can thus be assigned the coordinates (x, y) which conform to the following ellipse function:

$$(x/xn)^2 + (y/yn)^2 = 1 \qquad (1)$$

For the coordinates of the longitudinal axis intersection point and of the transverse axis intersection point of each ellipse or of each elliptical shell, the following relationship holds true:

$$(yn)^2 - (xn)^2 = 1 \qquad (2)$$

By virtue of the fact that the facet surfaces 15 are arranged on the elliptical shells 18a-j, the collector mirror 10 is able to reflect electromagnetic used rays in an EUV spectral range, which emanate from the first focal point F1 and pass to the mirror surface 17 of the collector mirror 10, at least one of the facet surfaces 15 and to focus them onto the second focal point F2. FIG. 1 shows by way of example two used rays 23, 25 which impinge on a respective ray incidence point P1, P2 on the respective facet surface 15 at an angle $\varphi1$, $\varphi2$ with respect to the optical axis OA. There the used rays 23, 25 are reflected and directed in the direction of the second focal point F2. Consequently, the used rays 23, 25 are focused onto the second focal point F2. For reasons of simplification, the focused used rays 23, 25 in FIG. 1 are illustrated as single lines, although in general a beam of rays of finite diameter impinges on the mirror surface 17.

Figure 2:
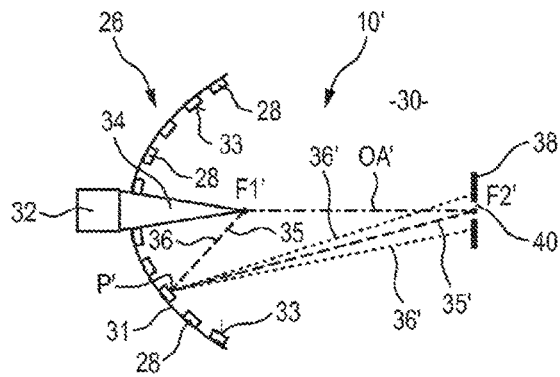
FIG. 2 shows a schematic sectional illustration of a collector mirror in accordance with the prior art.

The collector mirror 10 is simultaneously able to direct electromagnetic remaining rays in a remaining spectral range different than the EUV spectral range, the remaining rays likewise emanating from the first focal point F1, after reflection or diffraction at the blazed grating 12, in at least one direction which deviates from the ray emerging direction of the used rays 23, 25 such that the remaining rays are blocked by a stop 38 situated at the second focal point F2, the stop being shown in FIG. 2.

FIG. 1 shows nine mirror facets 14, wherein only one facet surface 15 is arranged on each of the elliptical shells 18a-j. However, the number of mirror facets 14 can be less or greater than nine. Moreover, the number of facet surfaces 15 arranged on an elliptical shell 18a-j can be greater than 1. In FIG. 1, furthermore, the elliptical shells 18a-j are spaced apart substantially equidistantly from one another along the optical axis OA. Consequently, the longitudinal axis intersection points 24a-j of the elliptical shells 18a-j are likewise spaced apart equidistantly from one another.

The facet surfaces 15 are furthermore arranged such that the elliptical shell 18a-j on which the facet surface 15 of the marginal-region-side mirror facet 14 of each adjacent mirror facet pair is arranged, is displaced from the elliptical shell 18a-j on which the facet surface 15 of the vertex-region-side mirror facet 14 of the same mirror facet pair is arranged, along the optical axis OA toward the first focal point F1. The mirror surface 17 resulting therefrom, in the sectional plane 16, is curved or "protuberant" toward the outermost vertex point 24j in comparison with the innermost elliptical shell 18a. At the same time, the mirror surface 17 is curved toward the innermost elliptical shell 18a in comparison with the outermost elliptical shell 18j in the marginal region 22. Hereinafter, the mirror surface 17 is referred to as "protuberant mirror surface", in order to differentiate it from an elliptical or a spherical mirror surface.

Broadband remaining rays can be suppressed on account of the special arrangement of the facet surfaces 15. In contrast thereto, the previous collector mirrors, in particular collector mirrors having a binary grating, can only suppress remaining rays of a single wavelength.

FIG. 2 shows an exemplary collector mirror 10' in accordance with the prior art, having a binary grating 26, wherein the binary grating 26 has a plurality of mirror facets 28. The collector mirror 10' includes an elliptical mirror surface 33, wherein the mirror facets 28 are arranged on a single elliptical shell 31 in the sectional plane 30 shown here. IR pump light 34 generated by a pump light source 32 bombards a target arranged at a first focal point F1'. By way of example a tin droplet is used as the target. A plasma, in particular a tin plasma, upon whose electronic transitions EUV light is generated, is generated as a result. The EUV light generated impinges as a used ray 35 on a ray incidence point P' on one of the mirror facets 28, at which the used ray 35 is reflected and focused onto a second focal point F2'. A stop 38 is arranged at the second focal point F2', the reflected used ray 35' passing through the aperture 40 of the stop. At the same time, an incident remaining ray 36 superimposed on the incident used ray 35 is diffracted at the mirror facet 28. The diffracted remaining ray 36' passes in two directions outside the reflected used ray 35' and is blocked by the stop 38. In this way, remaining rays are suppressed by the collector mirror 10' in interaction with the stop 38.

In contrast to the elliptical collector mirror 10' in FIG. 2, the facet surfaces 15 of the "protuberant" collector mirror 10 in FIG. 1 are not arranged on a single elliptical shell, but rather on a confocal ellipse family 18. Besides broadband remaining ray suppression, the collector mirror 10 enables an at least reduced change in the imaging scale along the mirror surface 17, such that the enlargement of the envelope of the etendue at the IF and in the far field is reduced.

Figure 3A:
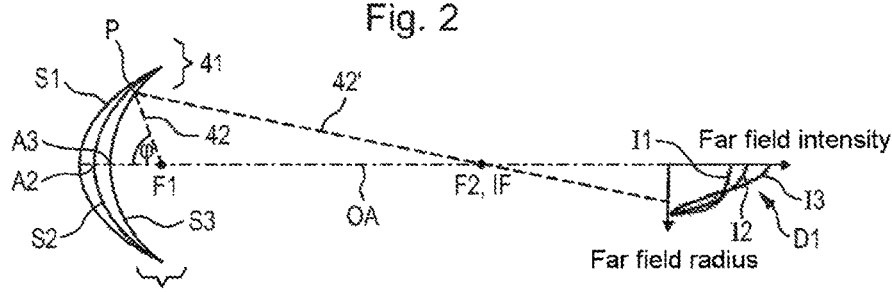
FIGS. 3A-B show a schematic illustration for elucidating the effects of different mirror surface profiles.

FIG. 3A shows three schematic mirror surface profiles S1-S3. The first profile S1 corresponds to a spherical mirror surface, the second profile S2 corresponds to a "protuberant" mirror surface, and the third profile S3 corresponds to an elliptical mirror surface. A used ray 42 emanating from the first focal point F1, at the angle $\varphi$ with respect to the optical axis OA, impinges on the ray incidence point P on one of the three mirror surface profiles S1-S3 and is reflected from there to the second focal point F2. Only the ray incidence on the elliptical mirror surface profile S3 is shown in FIG. 3A, for reasons of simplification.

The intensity of a used ray 42' focused by the respective mirror surface in the far field as a function of a far field radius, i.e. the distance between the location of the ray intensity measurement and the optical axis OA, is shown by I1, I2, I3 in the diagram D1. In comparison with the intensity distribution I1 of the elliptical mirror surface, the intensity distribution I2 of the "protuberant" mirror surface changes weekly with a variable far field radius. In other words, the intensity distribution I2 of the "protuberant" mirror surface is more homogeneous compared with the elliptical mirror surface. This is attributable to a reduced enlargement of the envelope of the entenue and ultimately to the reduced variation of the imaging scale of the "protuberant" collector mirror in comparison with the elliptical collector mirror.

The imaging scale $V(\varphi)$, as already introduced above, is defined as the ratio between the distance $dF1-P(\varphi)$ from the first focal point F1 to the ray incidence point P, on the one hand, and the distance $dP(\varphi)-F2$ from the ray incidence point P to the second focal point F2, on the other hand:

$$V(\varphi):=dF1-P(\varphi)/dP(\varphi)-F2 \quad (3)$$

The dependence of the imaging scale $V(\varphi)$ on the angle $\varphi$ differs depending on the type of mirror surface. In the case of spherical mirror surfaces (S1), the imaging scale $V(\varphi)$ is virtually independent of the angle $\varphi$, while, in the case of elliptical mirror surfaces (S3), the imaging scale $V(\varphi)$ varies greatly with a varying angle $\varphi$. In the case of the "protuberant" mirror surface, the imaging scale $V(\varphi)$ does vary with the angle $\varphi$, but to a less pronounced extent than in the case of elliptical mirror surfaces.

The mirror surface profiles S1-S3 lead into identical ends 14. This means that the collector mirrors associated with these profiles S1-S3 have substantially the same collector mirror diameter. Furthermore, the longitudinal axis intersection point A2 of the "protuberant" profile S2 is further away from the first focal point F1 than the longitudinal axis intersection point A3 of the elliptical profile S3. The distance between the longitudinal axis intersection point A2, A3 and the first focal point F1 is known as the "working distance" of a collector mirror. The greater the working distance, the further apart from the highly energetic plasma the collector mirror is situated, which promises an increased resistance to heat and radiation. This means that the "protuberant" collector mirror is subjected to less thermal and radiation loading compared with an elliptical collector mirror having the same diameter.

Figure 3B:
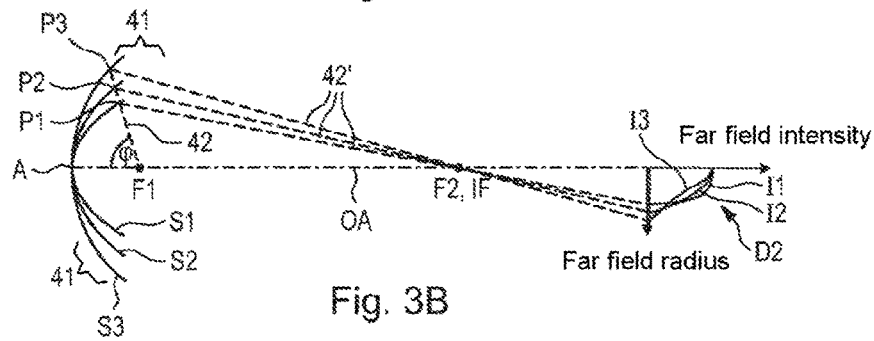

In the case of the schematic mirror surface profiles S1-S3 shown in FIG. 3B, the longitudinal axis intersection points A coincide. The collector mirrors associated with these profiles S1-S3 therefore have the same working distance. At the same time, the "protuberant" profile S2 has a smaller extent between its two ends 41, than the elliptical profile S3. The "protuberant" collector mirror associated with the profile S2 thus has a smaller diameter than the elliptical collector mirror associated with the profile S3. The smaller the diameter, the more compact the collector mirror and the lower the weight thereof. This means that the "protuberant" collector mirror can be formed more compactly and with a lower weight compared with an elliptical collector mirror having the same working distance.

Figure 4:
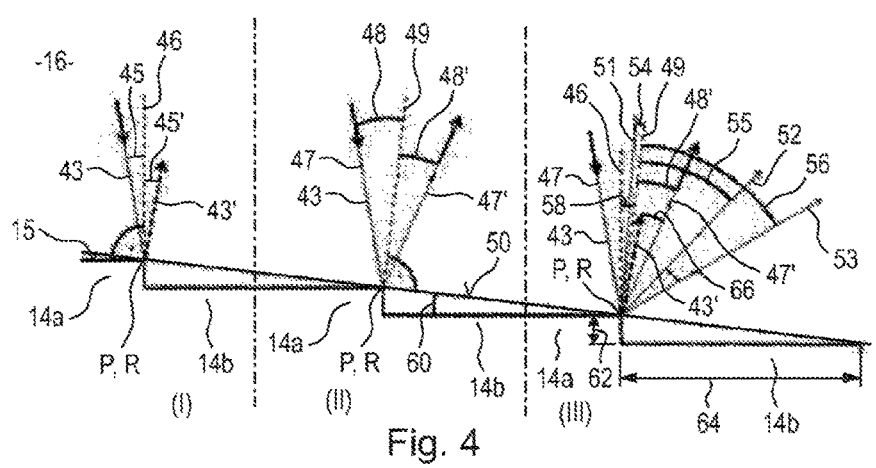
FIG. 4 shows a schematic illustration for elucidating the spatial separation of reflected used rays from diffracted remaining rays via the collector mirror in FIG. 1.

FIG. 4 shows a schematic illustration for elucidating the spatial separation of reflected used rays from remaining rays by mean of the collector mirror 10 in FIG. 1. FIG. 4 contains three regions (I)-(III), each of which shows a transition between two adjacent mirror facets 14a, b of a blazed grating 12, wherein the regions (II) and (III) show the same transition of the region (I).

In the region (I), an incident used ray 43 impinges on the ray incidence point P at a used ray incidence angle 45, wherein the used ray incidence angle 45 is related to a facet normal 46 perpendicular to the facet surface 15, and wherein the ray incidence point P coincides with a connection point R between the adjacent mirror facets 14a, b. The incident used ray 43 is reflected at the facet surface 15. The reflected used ray 45' passes at a used ray reflection angle 45' relative to the facet normal 42, wherein the used ray reflection angle 45' is equal to the used ray incidence angle 45. The used ray 45' reflected at the facet surface 15 is referred to as "specular facet reflection".

In the region (II), an incident remaining ray 47 superimposed on the incident used ray 43 impinges on the ray incidence point P at a remaining ray incidence angle 48, wherein the remaining ray incidence angle 48 is related to a grating surface normal 49 directed perpendicularly to a grating surface 50. In the sectional plane 16 shown here, the profile of the grating surface 48 corresponds to a connecting line of the connection points R between the adjacent mirror facets 14a, b. Diffraction effects occur at the ray incidence point P owing to the very much greater wavelength of the remaining ray 47. The remaining ray 47' diffracted at the order of diffraction 0 passes at a zeroth remaining ray reflection angle 48' relative to the grating surface normal 46, wherein the zeroth remaining ray reflecting angle 48' is equal to the remaining ray incidence angle 44. Furthermore, a blaze angle 60 for the mirror facet 14b is shown here, i.e. the angle by which the facet surface 15 of the mirror facet 14b is inclined relative to the grating surface 50.

As is shown in the region (III), the mirror facet 14b has a step height 62 and a facet length 64, wherein the ratio between the step height 62 and the facet length 64 corresponds to the tangent of the blaze angle 60.

In the region (III), besides the ray paths shown in the regions (I) and (II), the remaining rays 51, 52, 53 respectively diffracted at the orders of diffraction 1, −1 and −2 can be seen, the remaining rays passing at a first, second and respectively third remaining ray reflection angle 54, 55, 56, relative to the grating surface normal 49. The grating surface normal 49 and the facet normal 46 form an angle 58 that is equal to the blaze angle 60. Furthermore, the remaining ray 47' diffracted at the order of diffraction 0 is deflected from the reflected used ray 43' by a deflection angle 66. Preferably, the deflection angle 66 is at least twice the blaze angle 60. At the same time, the reflected used ray 43' passes, preferably centrally, between the diffracted remaining rays of the order of diffraction 0, on the one hand, and the deflected remaining ray 51 of the order of diffraction 1, on the other hand. With further preference, the orders of diffraction 0, 1, −1 and/or −2 relate to a minimum wavelength λmin of an IR spectral range.

Figure 5:
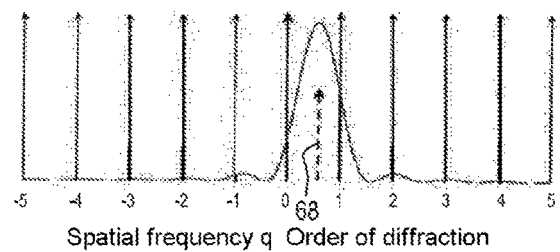
FIG. 5 shows a schematic diagram of an intensity distribution in the far field as a function of the spatial frequency or the order of diffraction.

FIG. 5 shows a schematic diagram of an intensity distribution of reflected used rays and diffracted remaining rays of different orders of diffraction in the far field as a function of the spatial frequency q. In a spatial direction 68 in which the spectral facet reflection passes, the intensity in the far field assumes its maximum, wherein the intensity distribution is substantially mirror-symmetrical about the spatial direction 68. Proceeding from the spatial direction 68, the intensity decays, wherein at integral spatial frequencies q=0, ±1, ±2, ±3, etc. which correspond to discrete spatial directions, the diffracted remaining rays are constructively superimposed and diffraction maxima arise in these discrete spatial directions. Apart from for the order of diffraction 0, the intensity and position of the diffraction maxima are dependent on the wavelength of the remaining rays. Furthermore, the intensity of the diffracted remaining ray decreases monotonically and drastically as the order of diffraction increases, i.e. toward the left and toward the right proceeding from the spatial frequency q=0 in FIG. 5.

In order to separate the diffracted remaining ray as much as possible from the specular reflection, it is firstly desirable for the specular facet reflection to pass as centrally as possible between the diffracted remaining rays of the orders of diffraction 0 and 1, since these two orders of diffraction, as shown in FIG. 5, have the highest intensity values among the orders of diffraction of the remaining ray. Moreover, it is advantageous if the intensity of the diffracted remaining ray decays to at least approximately 0 within a few orders of diffraction around the spatial direction 68 of the specular facet reflection. This can be achieved via a corresponding choice of the blazed grating 12, for example with a gap filling degree of approximately one. The gap filling degree is a measure of the diffraction efficiency of a diffraction grating. For the diffraction efficiency I(q) of the reflected used ray and of the diffracted remaining ray of different orders of diffraction as a function of the spatial frequency q, the following holds true in the far field:

$$I(q)=\sin c(\pi*\sigma*(q-\theta))^2 \quad (4)$$

In this case, σ is the gap filling degree and θ is the spatial frequency of the specular reflection. θ is usually dependent on the wavelength of the used ray. In EUV microlithography, in which the EUV light having a wavelength of 13.5 nm is used as used rays, θ is therefore a fixed quantity. σ can vary between 0 and 1, wherein at σ~1 the intensity of the diffracted remaining ray decays to at least approximately 0 within two or three orders of diffraction around the spatial direction 68 of the specular facet reflection. This advantageously promotes an efficient suppression of remaining rays and enables a focusing of the EUV light with a homogenous far field intensity distribution and high purity.

The step height 62, the facet length 64 and the blaze angle 60 in FIG. 4 are local variables that are dependent on the angle φ between the ray incidence direction and the optical axis OA, wherein the ray incidence direction is defined by the first focal point F1 and the ray incidence point P. At small blaze angles 60, these three variables are interlinked approximately by $\alpha(\varphi)=h(\varphi)/l(\varphi)$, wherein $\alpha(\varphi)$ describes the blaze angle profile, l(φ) describes the facet length profile and h(φ) describes the step height profile. This means that two of the three variables above can vary arbitrarily, while the third variable is fixed.

Figure 6A:
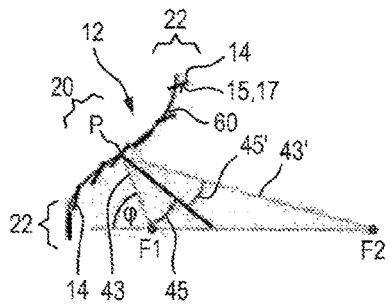
FIG. 6A shows a schematic illustration for elucidating the profile of the blaze angle.

By way of example, the blaze angle profile α(φ) can be fixed, as shown schematically in FIG. 6A. In that case, the blaze angle 60 increases from the marginal region 22 toward the vertex region 20, such that the imaging scale varies only weakly along the mirror surface 17. The enlargement of the envelope of the etendue is reduced as a result. Preferably, the blaze angle 60 is chosen from a range of 1 mrad to 100 mrad.

By fixing the blaze angle profile α(φ), the local shape deviation of the mirror surface 17 of the blazed grating 12 from an elliptical mirror surface is also fixed. Therefore, the local ray incidence angle 45 or the direction of the specular facet reflection for each mirror facet 14 and thus also the basic shape of the surface of the blazed grating 12 are fixed.

Alternatively, the facet length profile l(φ) can be fixed, as a result of which the directions in which the diffracted remaining rays of higher wavelength-dependent orders of diffraction pass are fixed. For short-wave used rays 43, the facet length 64 can be chosen to be sufficiently large, preferably in the range l(φ)>10 μm, such that diffraction effects of the EUV light can be largely disregarded. In addition, the step height profile h(φ) can be at least partly fixed in order additionally to suppress diffraction effects of the used ray 43.

In order, however, that the diffraction effects for long-wave remaining rays cannot be disregarded, the facet length 64 is chosen to be sufficiently small, preferably in the range l(φ)<200 μm. This results in a plurality of emerging directions for the diffracted remaining ray, thereby reducing the probability of the diffracted remaining ray being focused onto the second focal point F2 in the same direction as the specular reflection 43'. Moreover, in this case, it is possible to employ mirror facets 14 having a focal length reciprocal value that is at least approximately 0. This corresponds to a virtually plane facet surface 15 which is producible particularly simply and with high quality regarding minimal surface roughness and gradient errors.

Moreover, it is possible to choose a maximum facet length lmax depending on the minimum wavelength λmin of the IR spectral range in order to suppress the highly intensive IR light as effectively as possible. By way of example, λmin can assume one of the following values: 10 μm, 1 μm, 200 nm, wherein the associated maximum facet length lmax is respectively 1000 μm, 100 μm and 20 μm. These three examples relate to a focal length of 0.5 m, a stop radius of 1 mm and a deflection angle of 5 mrad between the specular facet reflection and the diffracted remaining ray at the order of diffraction zero.

Figure 6B:
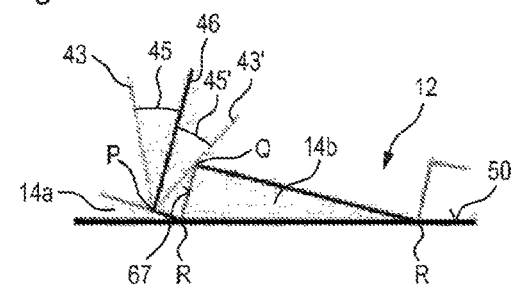
FIG. 6B shows a schematic illustration for elucidating the shading effects between adjacent mirror facets.

FIG. 6B illustratively shows the shading effect of two adjacent mirror facets 14a,b of the blazed grating 12. The incident used ray 43 is reflected at the facet surface 15 of the first mirror facet 14a, wherein the specular facet reflection 43' passes in a direction that is defined by the ray incidence point P and a corner point Q of the second mirror facet 14b. The region of the facet surface 15 of the first mirror facet 14a between the ray incidence point P and the connection point R is thus shaded since specular facet reflections 43' emanating from this region are blocked by a side surface 67 of the second mirror facet 14b. The length of the shading region in the illustration shown here results from the length of the side surface 67 multiplied by the tangent of the useful ray incidence angle 45.

Figure 7A:
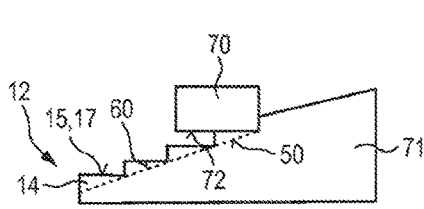
FIGS. 7A-B show an illustrative representation of a method for producing the collector mirror in FIG. 1.
Figure 7B:
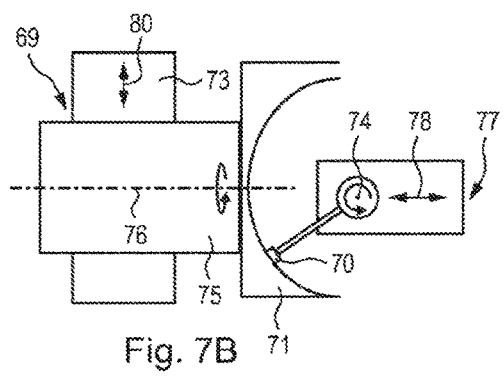

The blazed grating 12 of the collector mirror 10 is preferably produced via an ultra-precision turning method (UP turning method) shown illustratively in FIGS. 7A, B. In this case, a UP turning apparatus 69 is used, including a main body 73, a rotary body 75 mounted on the main body 73, and a structuring unit 77. The rotary body 75 is rotatable about a spindle axis 76. A grating workpiece 71 is fixed to the rotary body 75. The grating workpiece 71 preferably includes an amorphous machinable layer containing, for example, nickel-phosphorus (NiP) and/or oxygen-free high-conductivity copper (OFHC-Cu). The structuring unit 77 includes a machining tool 70, for example a diamond tool, which has a pressure side 72. The structuring unit 77 is movable parallel to the spindle axis 76 in both directions, as indicated by the double-headed arrow 78. Furthermore, the tool 70 is rotatable in the clockwise direction and/or in the counterclockwise direction about a machine axis 74, which is perpendicular to the plane of the drawing in the illustration shown here. The pressure side 72 is embodied such that it is plane and/or curved. The rotary body 75 is height-adjustable on the main body 73, which is indicated by the double-headed arrow 80.

Figure 8A:
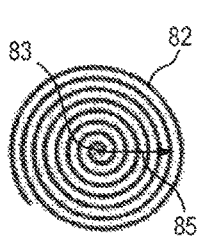
FIGS. 8A-B show an illustrative representation of a movement path of a machining tool relative to a grating workpiece in the method in FIGS. 7A-B.
Figure 8B:
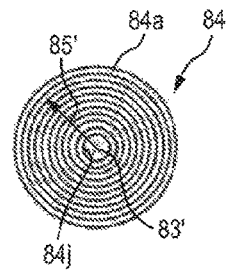

FIG. 8A shows a schematic spiral path 82 formed spirally about an axis 83 running perpendicularly to the plane of the drawing. The spiral path 82 is shown in a view along the axis 83 in FIG. 8A, wherein the spiral path 82 considered spatially extends continuously in a direction out of the plane of the drawing along the axis 83 as the path radius 85 increases. FIG. 8B shows a schematic path arrangement 84 including circular paths 84a-j which are concentric with respect to an axis 83'. Analogously to FIG. 8A, the circular paths 84a-j are shown in a view along the axis 83' in FIG. 8B, wherein the circular paths 84a-j considered spatially extend in a direction out of the plane of the drawing as the path radius 85' increases.

For structuring the grating workpiece 71, the latter is firstly secured to the rotary body 75 of the UP turning apparatus 69. Afterward, the tool 70 is brought to a desired position relative to the grating workpiece 71, which desired position corresponds to the desired surface shape of the facet surface 15 to be formed. Afterward, the grating workpiece 71 is moved with the aid of the rotary body 75 relative to the tool 70 along the spiral path 82 (FIG. 8A) and/or the path arrangement 84 (FIG. 8B), wherein the relative rotational movement for moving along the spiral path 82 and the path arrangement 84 is realized via the rotation of the rotary body 75 about the spindle axis 76.

Upon following the spiral path 82, a continuous movement takes place between the tool 70 and the grating workpiece 71, the tool 70 being constantly in engagement with the grating workpiece 71. During structuring in accordance with the path arrangement 84 including concentric circles 84a-j, the tool 70 is alternately lowered into the surface of the grating workpiece 71 and raised.

After the spiral path 82 or the path arrangement 84 has been completely followed, the mirror surface 17 of the blazed grating 12 acquires its desired profile. This means that the profile of the blaze angle 60 is fixed. The blazed grating 12 produced by this means is rotationally symmetrical about the spindle axis 76 at least in sections.

The pressure side 72 of the tool 70 has a plane surface, which is particularly advantageous with regard to reducing the edge rounding since, in the case of a plane pressure side 72, the edge rounding is vanishing small even in the case of large step heights. An increase in the used ray transmission by up to 10% occurs as a result. Moreover, the path distance, i.e. the dimensioning of the contact area between the pressure side 72 and the grating workpiece 71, is significantly increased on account of the plane pressure side 72, such that the number of turning and machining processes for structuring the entire blazed grating 12 is reduced. The processing time and/or wear of the tool 70 are/is advantageously reduced as a result. The influence of vibrations of the tool 70 on the surface roughness is negligible. A maximum surface roughness in the range of 1 nm to 2 nm can be realized with the aid of the UP turning method. Furthermore, the lateral offset of the second focal point F2 when moving along the spiral path 82 is negligible on account of the small path distances.

Figure 9:
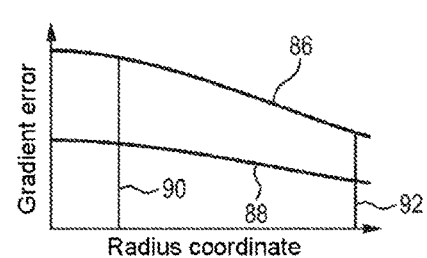
FIG. 9 shows a schematic diagram of a gradient error as a function of a radius coordinate.

A further advantage that results from a plane pressure side 72 consists in a significantly reduced gradient error of the mirror facets 14. Using the plane pressure side 72, it is possible to realize facet surfaces 15 whose maximum gradient error is substantially proportional to the facet length 64. This means that, given the choice of a sufficiently small facet length 64, other effects that contribute to the gradient error can be suppressed. FIG. 9 shows a schematic diagram in which a maximum gradient error 86 and an average gradient error 88 are plotted as a function of a radius coordinate of the radius 85, 85' of the spiral path 82 or of the path arrangement 84. The radius coordinate varies between a minimum radius 90 and a minimum radius 92. Given a facet length 64 of 100 µm, the maximum gradient error, on account of the plane pressure side 72, is reduced by 90% compared with the collector mirrors known from the prior art.

Preferably, the mirror facets 14 and/or the facet surfaces 15 are formed in each case via a single machining process in which the facet surface 15 is engaged by the pressure side 72 of the tool 70 facing the grating workpiece 71. The individual mirror facets 14 and/or the individual facet surfaces 15 thus result as an "image" of the pressure side 72. The processing time can advantageously be reduced further as a result.

In order to minimize the surface roughness of the mirror facets 14, in accordance with one exemplary embodiment, after the UP turning method, the prestructured grating workpiece 71 is smoothed in a smoothing process. Non-mechanical smoothing, e.g. ion beam smoothing and/or liquid-film smoothing, is preferably carried out. Ion beam smoothing is known from the publication Frost et al., "Large area smoothing of surfaces by ion bombardment: fundamentals and applications, J. Phys.: Condens. Matter 21, 22, 224026" the content of which is hereby incorporated in the application. Liquid-film smoothing is known from the patent application US2014/0118830A1, the content of which is hereby incorporated in the application. A reduced rounding of the grating structure can advantageously be achieved by this means.

In order to improve the reflection properties of the mirror surface 17, that side of the grating workpiece 71 which is surface-processed in the smoothing process is coated over with a layer stack including a plurality of alternating individual layers of molybdenum and silicon, wherein a layer thickness of the individual layers is chosen depending on a local ray incidence angle with respect to the individual facet surfaces. Such an MoSi stack layer is advantageous since each mirror facet 14 is individually optimized in terms of its reflection properties to its desired local ray incidence angle. The mirror surface 17 advantageously focuses the EUV light at the mirror surface 17 uniformly and precisely onto the second focal point F2. Preferably, the structured side of the grating workpiece is coated over with a material before and/or after the application of the MoSi stack layer, the material including aluminum and/or a dielectric protection, e.g. MgF2. The latter additionally protects the mirror surface 17 of the blazed grating 12 against degradation effects.

The blazed grating 12 preferably has a root-mean-square (RMS) microroughness in the range of 0 to 0.2 nm, wherein an upper limit of 0.2 nm corresponds to approximately 1/80 of the EUV wavelength. As a result, a stray light loss of the EUV light can advantageously be reduced to a maximum of 2.5%. With further preference, the collector mirror 10 includes at least one antiblaze facet having an inclination angle of at least 25°.

It goes without saying that the collector mirror 10 is suitable not only for EUV microlithography with a wavelength of 13.5 nm, but also for microlithographic applications in which exposure light having a different wavelength, for example up to 400 nm, preferably up to 200 nm, can be used.

A further exemplary embodiment of a mirror 100 is described with reference to FIGS. 10 and 11. Elements of the mirror 100 which are identical, similar or comparable to elements of the exemplary embodiment in FIG. 1 are provided with reference signs increased by 100. Unless described otherwise below, the above description is also applicable with respect to the mirror 100.

Figure 10:
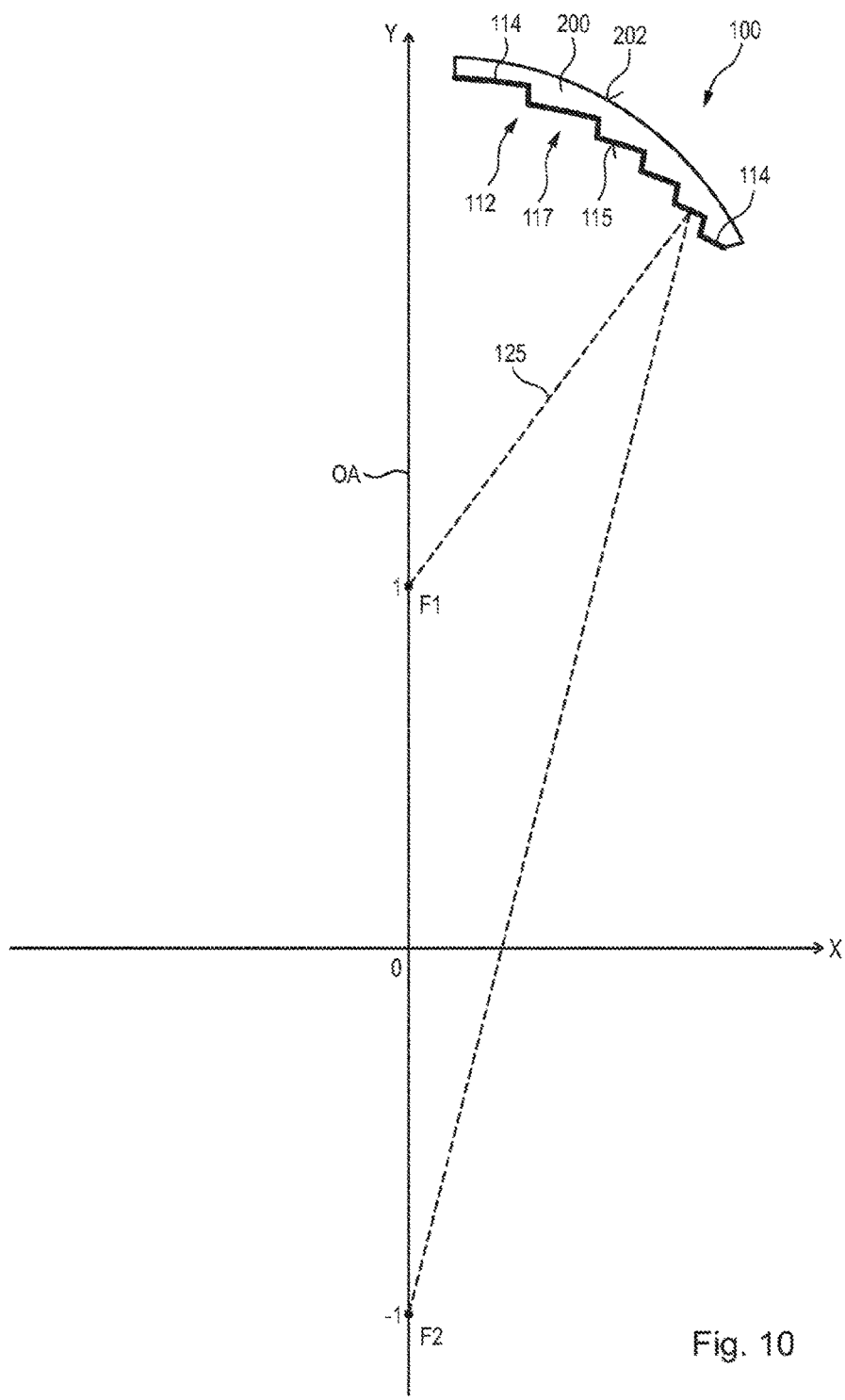
FIGS. 10 and 11 show a schematic sectional illustration of a mirror in accordance with a further exemplary embodiment.

In accordance with FIG. 10, the mirror 100 includes an optical grating 112 including an optically effective mirror surface 117, which focuses electromagnetic radiation 125 emanating from a first focal point F1 into a second focal point F2. The focal points F1 and F2 define the optical axis OA. The optical grating 112 includes a plurality of mirror facets 114 each having a facet surface 115, wherein the facet surfaces 115 form the mirror surface 117 of the optical grating 112.

On its rear side, the mirror 100 includes a substrate 200.

Figure 11:
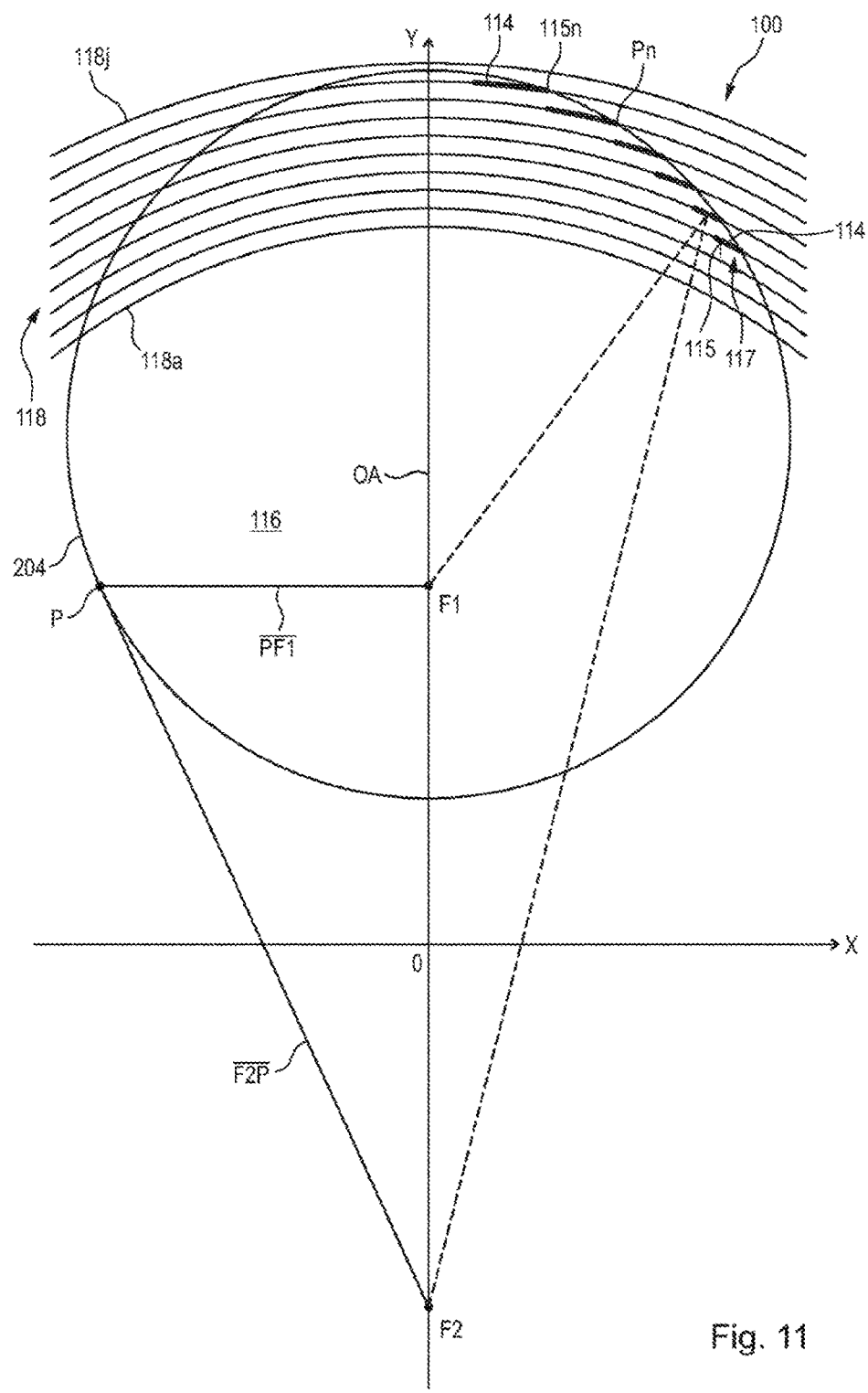

In accordance with FIG. 11, the facet surfaces 115, as in the case of the collector mirror 10, in a sectional plane 116 including the optical axis OA, are arranged on a plurality of imaginary elliptical shells 118$a$-$j$ of an ellipse family 118 that are displaced from one another along the optical axis OA. However, the individual facet surfaces 115 additionally satisfy a further arrangement specification described below.

FIG. 11 depicts an imaginary circular line 204 which is given by the set k of all points P for which the following holds true:

$$k=\{P|\overline{F2P}\cdot\overline{PF1}=\lambda\} \quad (5)$$

wherein λ is a constant. The circular line or the circle 204 is also referred to as an appolon circle. The ratio of the distance from the focal point F2 to the respective point P and the distance from the point P to the focal point F1 is thus equal to the fixed value λ for all points P on the circular line 204.

The facet surfaces 115 are then distributed along the elliptical shells 118$a$-$j$ of the ellipse family 118 such that the facet surfaces 115 are arranged at intersection points Pn of the elliptical shells 118$a$-$j$ with at least one section of the imaginary circular line 204. The imaging scales of the individual mirror facets 114 are thus at least approximately identical among one another. The mirror 100 thus has a constant imaging scale as viewed over its mirror surface 117, that is to say that the focal point F1 is focused onto the focal point F2 by all the mirror facets 114 in the present case. A sharp image or intermediate image thus arises at the focal point F2.

In the exemplary embodiment shown in accordance with FIG. 11, base points 115$n$ of the facet surfaces 115 are arranged at the intersection points Pn of the circular line 204 with the elliptical shells 118$a$-$j$.

The mirror 100 does not just have a constant imaging scale as viewed over its mirror surface 117, rather a surface 202 of the substrate 200 can be embodied in particular as spherical, which significantly simplifies manufacture. In contrast to the mirror surface 17, the mirror surface 117 is not protuberant, but rather spherical.

Furthermore, in the exemplary embodiment shown, the mirror surface 117 of the mirror 100 is arranged completely outside the optical axis OA. The mirror 100 is thus operated "off-axis". The optical grating 112 is preferably a blazed grating, but can also be a Fresnel structure.

The collector mirror 10 in FIG. 1 can likewise be configured such that the facet surfaces 15, as in the case of the mirror 100, are arranged at intersection points of an Appolonian circle with the elliptical shells 18*a-j*. It is thus possible for a mirror construction as in the case of the mirror 100 also to be employed for a collector mirror. In this case, the individual mirror facets 114 are embodied rotationally symmetrically about the optical axis OA at least in sections.

The mirror 100, in particular in the "off-axis" configuration in accordance with FIG. 10, can be used as an imaging mirror within an optical system, for example an EUV microlithography system, or an optical UV system.

What is claimed is:

1. A mirror, comprising:
   an optical grating comprising an optically effective mirror surface configured to reflect electromagnetic rays emanating from a first focal point and to focus them onto a second focal point,
   wherein:
      the first and the second focal points lie on a side of the optical grating facing the optically effective mirror surface and define an optical axis;
      the optical grating comprises a plurality of mirror facets;
      each mirror facet comprises a facet surface;
      the facet surfaces define the optically effective surface of the optical grating;
      in a sectional plane that includes the optical axis, the facet surfaces are arranged on a plurality of imaginary elliptical shells displaced from each other along the optical axis;
      common mathematical focus points of the imaginary elliptical shells coincide with the first and second focal points;
      the facet surfaces are distributed along the elliptical shells so that the facet surfaces are arranged at intersection points of the elliptical shells with at least one section of an imaginary circular line; and
      for each point on the circular line, a ratio of a distance from the first focal point to the point is the same as a ratio of a distance from the point to the second focal point.

2. The mirror of claim 1, wherein base points of the mirror facets are arranged at the intersection points of the elliptical shells.

3. The mirror of claim 1, wherein the optically effective mirror surface is arranged completely outside the optical axis.

4. The mirror of claim 1, wherein:
   the optically effective mirror surface extends along the imaginary elliptical shells;
   a marginal-region-side mirror facet of an adjacent mirror facet pair is arranged on a first elliptical shell;
   a vertex-region-side mirror facet of the mirror facet pair is arranged on a second elliptical shell adjacent to the first elliptical shell; and
   the first elliptical shell is displaced from the second elliptical shell along the optical axis toward the first focal point.

5. The mirror of claim 1, wherein the optical grating comprises a blazed grating or a Fresnel structure.

6. The mirror claim 1, wherein the optical grating comprises a blazed grating having a blaze angle by which each facet surfaces is inclined locally relative to a grating surface, and the blaze angle increases from a marginal region toward a vertex region.

7. The mirror of claim 6, wherein:
   the optically effective mirror surface is configured to reflect electromagnetic used rays in an EUV spectral range emanating from the first focal point and to focus the electromagnetic rays onto the second focal point;
   the optical grating is configured, in interaction with a stop arranged at the second focal point, to allow the used rays to pass through the stop and to block electromagnetic remaining rays in a remaining spectral range different than the EUV spectral range;
   the grating comprises a diffraction grating configured to diffract the remaining rays;
   the used rays reflected at the mirror surface are deflected from the diffracted remaining rays of the zero order of diffraction by at least twice the blaze angle and/or pass between the diffracted remaining rays of the zero and the first orders of diffraction.

8. The mirror of claim 7, wherein the remaining spectral range comprises an infrared spectral range, and the zero and the first orders of diffraction are related to the diffracted remaining rays having a minimum wavelength of the remaining spectral range.

9. The mirror of claim 7, wherein:
   in the sectional plane, each facet surface has a facet length;
   at least two facet lengths are different, and/or the facet length does not exceed a maximum facet length dependent on a minimum wavelength of the remaining spectral range.

10. The mirror of claim 9, wherein, in the sectional plane, each facet surface has a facet length in the range of 10 μm to 200 μm.

11. The mirror of claim 1, wherein each elliptical shell has only one facet surface arranged thereon.

12. The mirror of claim 1, wherein the elliptical shells are substantially equidistantly spaced from each other along the optical axis.

13. The mirror of claim 1, wherein:
   at least two mirror facets have a focal length reciprocal value of at least approximately 0; or
   at least two mirror facets have an identical focal length reciprocal value.

14. The mirror of claim 1, wherein the optical grating has a surface roughness in the range of 0 to 0.2 nm.

15. The mirror of claim 1, wherein the grating has an edge rounding having a radius in the range of 0 to 1 μm.

16. The mirror of claim 1, wherein, for each facet surface:
   the facet surface comprises a layer stack comprising a plurality of alternating individual layers of molybdenum and silicon; and
   a layer thickness of the individual layers is dependent on a local ray incidence angle with respect to the individual facet surface.

17. A method, comprising:
   An ultra precision turning method in which, relative to a grating workpiece, a machining tool is moved relative along a spiral path and/or a path arrangement comprising concentric circles, thereby providing a mirror according to claim 1.

18. The method of claim 17, wherein, for each mirror facet, the method comprises a single machining process in which the mirror surface is engaged by a pressure side of the machining tool facing the mirror surface.

19. The mirror of claim 17, further comprising, after the ultra precision turning method, using ion beams and/or at least one liquid film to smooth the facet surfaces.

20. A system, comprising:
a mirror according to claim 1,
wherein the system is an EUV microlithography system.

* * * * *

UNITED STATES PATENT AND TRADEMARK OFFICE
CERTIFICATE OF CORRECTION

PATENT NO.         : 10,101,569 B2
APPLICATION NO.    : 15/601337
DATED              : October 16, 2018
INVENTOR(S)        : Markus Bauer Page 1 of 1

It is certified that error appears in the above-identified patent and that said Letters Patent is hereby corrected as shown below:

In the Specification

Column 19, Line 11-12, delete "Appolonian" and insert -- Apollonian --.

In the Claims

Column 20, Line 3, in Claim 6, after "mirror" insert -- of --.

Column 20, Line 63, in Claim 17, delete "An" and insert -- an --.

Signed and Sealed this
Ninth Day of April, 2019

Andrei Iancu
*Director of the United States Patent and Trademark Office*